(12) United States Patent
Choi (10) Patent No.: US 6,475,399 B2
(45) Date of Patent: Nov. 5, 2002

(54) METHOD FOR FABRICATING A STENCIL MASK

(75) Inventor: Jae Seung Choi, Chungcheongbuk-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 09/892,552

(22) Filed: Jun. 28, 2001

(65) Prior Publication Data

US 2002/0001964 A1 Jan. 3, 2002

(30) Foreign Application Priority Data

Jun. 28, 2000 (KR) ........................................ 2000-36137

(51) Int. Cl.[7] .................. B44C 1/22; C03C 15/00; C23F 1/00; H01L 21/00
(52) U.S. Cl. .................. 216/12; 216/33; 216/41; 216/45; 216/66; 438/707; 438/719; 438/740; 438/745
(58) Field of Search .................. 216/12, 33, 41, 216/45, 66, 67, 75, 79, 99, 100; 438/707, 712, 713, 719, 720, 723, 724, 725, 740, 742, 743, 744, 745

(56) References Cited

U.S. PATENT DOCUMENTS 5,302,240 A * 4/1994 Hori et al. .................. 438/719
6,150,280 A * 11/2000 Yamashita .............. 438/719 X

* cited by examiner

Primary Examiner—William A. Powell
(74) Attorney, Agent, or Firm—Pillsbury Winthrop LLP

(57) ABSTRACT

Disclosed is a method for fabricating a stencil mask for use in electron beam lithography which improves resolution by effectively reducing beam blur resulting from coulomb repulsion effects in the electron beam. The disclosed method includes fabricating a first mask and a second mask that are then aligned and joined to form the final stencil mask. The structure of the second mask limits the number and controls the initial pattern of the electrons that pass through the stencil mask to limit beam blur, narrow the incident energy distribution, and improve the resolution of the final image.

9 Claims, 8 Drawing Sheets

Etching

Etching

METHOD FOR FABRICATING A STENCIL MASK

BACKGROUND OF THE INVENTION

1. Field of the Invention

The present invention relates to a method for fabricating a stencil mask and, more particularly, to method for producing a stencil mask that provides improved resolution by effectively reducing beam blur resulting from coulomb repulsion effects in the electron beam used in electron beam photolithography.

2. Description of the Related Art

Figure 1A:
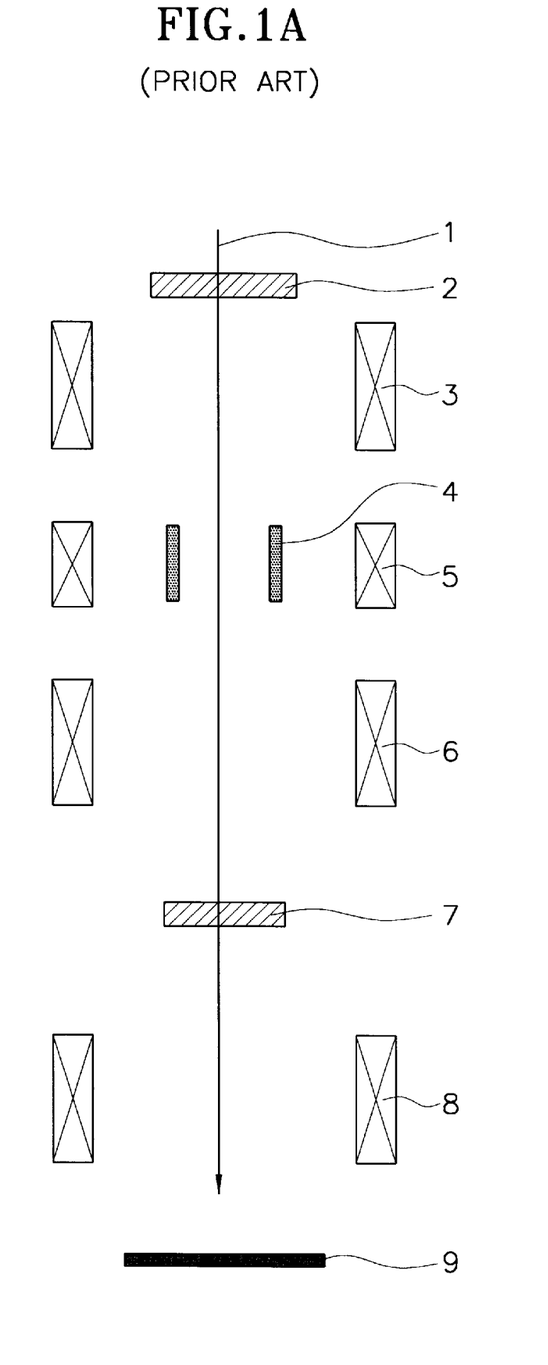
FIG. 1A is a general view illustrating the typical electron beam photolithography.

FIG. 1A is a general representation of elements of an electron beam imaging device for illustrating the general principles of electron beam photolithography.

The imaging device of FIG. 1A includes: a first stencil mask 2 through which an electron beam 1 is transmitted, a first shaping lens 3 situated under the first stencil mask 2, a rotation correcting lenses 5 situated under the first shaping lens 3, deflectors 4 situated in the rotation correcting lens 5, a second shaping lens 6 situated under the rotation correcting lens 5, a second stencil mask 7 situated under the second shaping lens 6, an objective lens 8 situated under the second stencil mask 7, and a wafer 9 upon which the image will be formed situated under the objective lens 8.

Figure 1B:
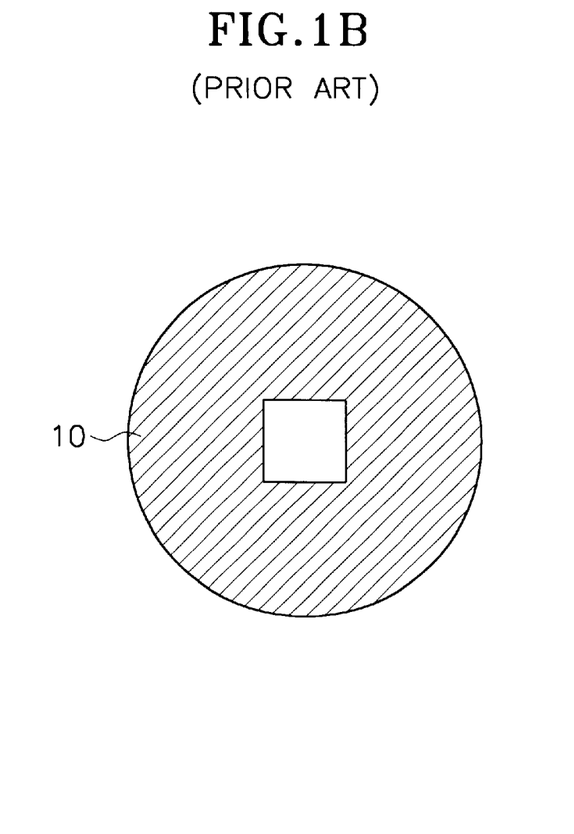
FIG. 1B is a plane view of the conventional stencil mask.
Figure 1C:
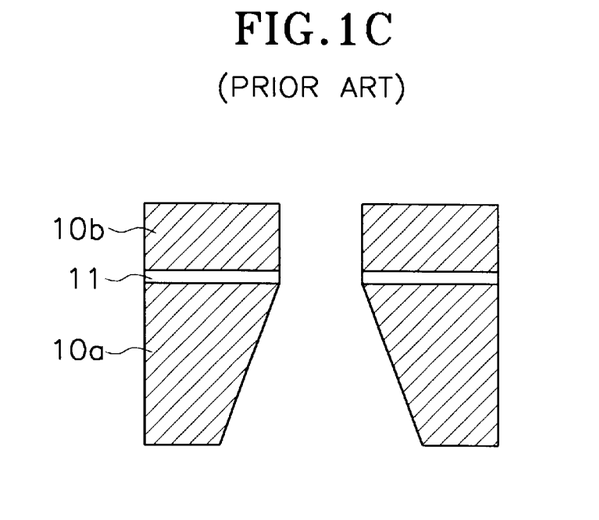
FIG. 1C is a side view of the conventional stencil mask.

FIG. 1B is a plane view of the conventional stencil mask, and FIG. 1C is a side view of the conventional stencil mask.

A stencil mask 10 comprises silicon. The thickness of the silicon film depends on accelerated voltage. For example, the silicon film of 20 μm thickness is needed to block electrons accelerated at an energy of 50 KeV.

In general, a stencil mask 10 is fabricated to have features 25 times the size of the corresponding features that will be imaged on the wafer. Therefore if the target width of a feature is 0.1 μm on the wafer, the corresponding feature on the mask is 2.5 μm.

The stencil masks typically have a rectangular shape, with the size of the resulting pattern on the wafer 9 depending on the degree of overlap between the first stencil mask 2 and the second stencil mask 7.

Figure 2:
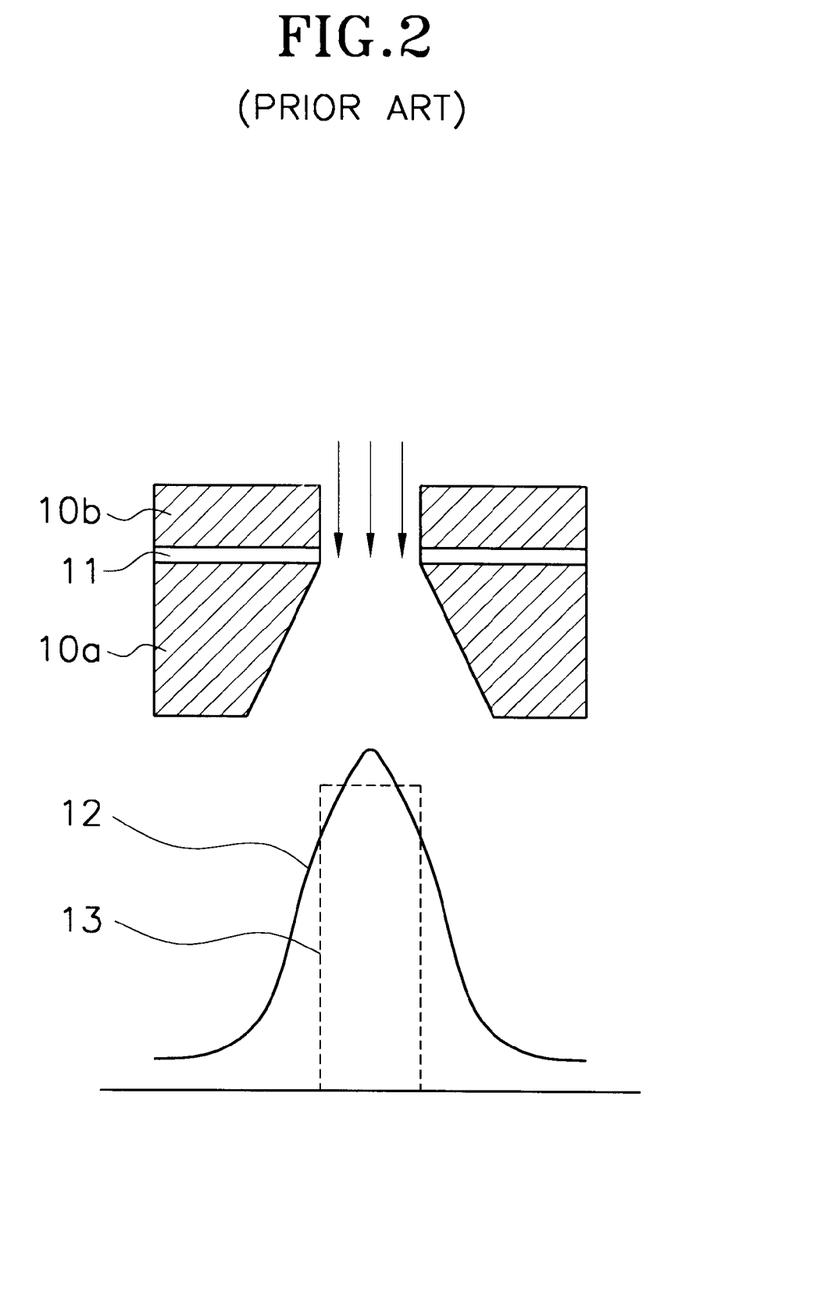
FIG. 2 is a drawing illustrating energy contrast of the conventional stencil mask.

However, in a conventional stencil mask, as shown in FIG. 2, the image contrast on wafer 9 is reduced by beam blurring, also referred to as beam spreading, resulting from coulomb repulsion effects within the electron beam. As a result, the overall resolution of the imaging system will be reduced.

In order to prevent such beam blurring, a method has been proposed in which the number of electrons passing through the stencil masks is selectively reduced. However, if the wafer pattern is to be formed by a 0.25 μm feature on the mask having the aspect ratio of 100:1 and the silicon film of 20 μm thickness, the high aspect ratio renders the etching process much more difficult.

SUMMARY OF THE INVENTION

Therefore, an object of the present invention is to provide a method for fabricating stencil masks that can improve resolution by effectively reducing beam blur resulting from coulomb repulsion effects in the electron beam.

To accomplish the object, the inventors have developed a method for fabricating a stencil mask comprising the steps of:

A method for fabricating a stencil mask comprising the steps of:
preparing a first wafer consisting of
a first silicon film having an upper surface and a lower surface,
a silicon oxide film formed on the upper surface of the first silicon film, and
a second silicon film, formed on an upper surface of the silicon oxide film;
forming a first photoresist film pattern on the second silicon film;
etching the second silicon film to expose the silicon oxide film and to form a first etched surface;
removing the first photoresist film pattern;
forming a first silicon nitride film on the first etched surface of the second silicon film and lower surface of the first silicon film and side walls of the first and second silicon films and the silicon oxide film;
forming a second photoresist film pattern on the second silicon nitride film;
etching the first silicon nitride film, the first silicon film, and the silicon oxide film using the second photoresist film pattern film as an etching mask;
removing the second photoresist pattern film;
removing the first silicon nitride film to form a first opening through the first wafer;
forming a first metal film on all surfaces of the first wafer, including the lower surface of the first silicon layer and the upper surface of the second silicon layer, to complete a first mask;
preparing a second wafer consisting of
a third silicon film having an upper surface and a lower surface,
a titanium film formed on the upper surface of the third silicon film,
a titanium nitride film formed on an upper surface of the titanium film, and
a second metal film formed on an upper surface of the titanium nitride film;
forming a third photoresist film pattern on an upper surface of the second metal film;
etching the second metal film, the titanium nitride film, and the titanium film to expose the third silicon film using the third photoresist film pattern as an etching mask to form a second etched surface;
removing the third photoresist film pattern;
forming a second silicon nitride film on the second etched surface of the third silicon film, the lower surface of the third silicon film and side wall of the second wafer;
forming a fourth photoresist film pattern on the second silicon nitride film on the lower part of the third silicon film;
etching the second silicon nitride film and the third silicon film using a fourth photoresist film pattern as an etching mask;
removing the fourth photoresist film pattern;
removing the second silicon nitride film to complete a second mask to form a plurality of second openings through the second wafer;
aligning the first opening with the second openings; and
joining the first mask and the second mask by applying a conductive adhesive between the first metal layer of the first mask and the second metal layer of the second mask to form the stencil mask.

The material used to form the first mask is preferably one of the metals selected from a group including Au, W, Pt, and Pd.

The thickness of the first mask layer is preferably between about 500 and 300 Å.

The material used to form the second mask is preferably one of the metals selected from a group including Au, W, Pt, and Pd.

The thickness of the second mask is preferably between about 500 and 3000 Å.

The first through the fourth silicon nitride films are $Si_3N_4$ and the first and the second masks are preferably joined together using a silver paste.

The above objects, and other features and advantages of the present invention will become more apparent after reading the following detailed description when taken in conjunction with the drawings.

BRIEF DESCRIPTION OF THE DRAWINGS

Now, referring to FIG. 3A through FIG. 3E, FIG. 4A and FIG. 4D, FIG. 5 and FIG. 6, a method for fabricating a stencil mask according to an embodiment of the present invention will be described in detail.

DETAILED DESCRIPTION OF THE INVENTION

In accordance with the present invention, the method for fabricating a stencil mask is as follows.

Figure 3A:
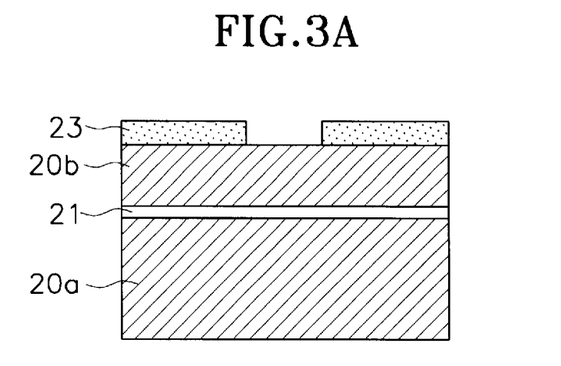
FIG. 3A through FIG. 3E are cross-sectional views of production steps of a first mask utilized in constructing a stencil mask in accordance with the present invention.

Referring to FIG. 3A, an active silicon wafer consisting of a first silicon film 20a, silicon oxide film 21, and a second silicon film 20b is prepared. And then a first photoresist film pattern 23 is formed over the active silicon wafer.

Figure 3B:
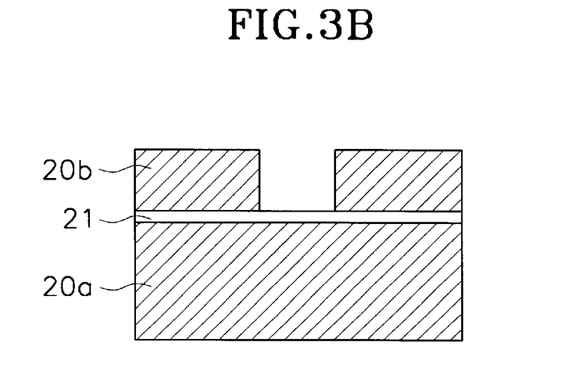

Referring to FIG. 3B, the second silicon film 20b is etched using the first photoresist film pattern 23 as a mask and using silicon oxide film 21 as an etching stopper layer.

Figure 3C:
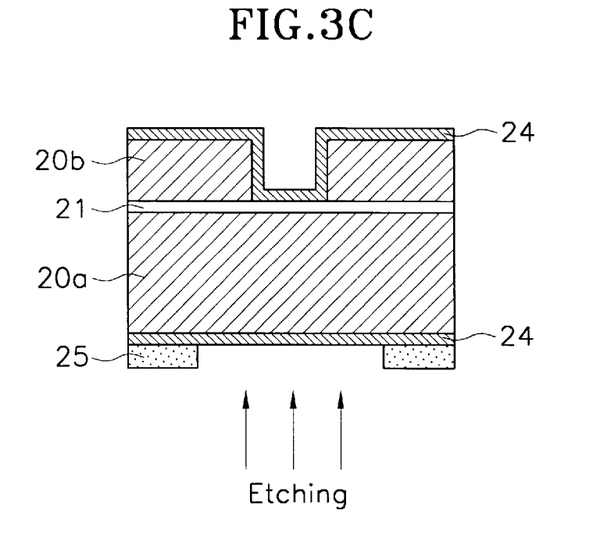

Referring to FIG. 3C, after removing the first photoresist film 23, the exposed surface of resulting structure including both the upper portion of the etched second silicon film 20b the exposed surface of the silicon oxide film 21, and the lower surface of the first silicon film 20a are coated with the silicon nitride film 24. The silicon nitride film 24 functions as a pattern protecting film. A second photoresist film pattern 25 is formed over the lower part of the silicon nitride film 24. A backside window patterning process is then performed on the backside of the wafer, that is, on the lower part of the silicon nitride film 24, using a second photoresist film pattern 25.

Figure 3D:
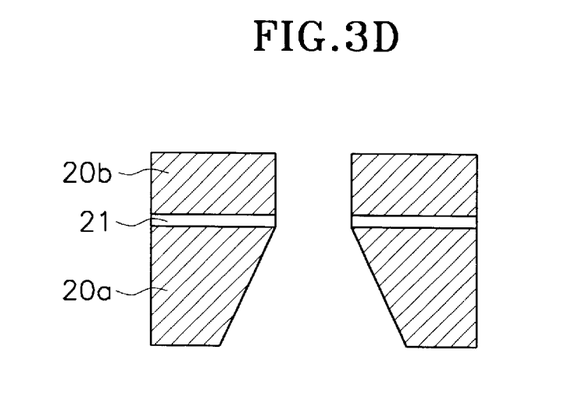

Referring to FIG. 3D, the exposed portion of the backside silicon nitride film 24, the first silicon film 20, and the silicon oxide film 21 are sequentially etched using the second photoresist film pattern 25 as an etching mask. After the etch has been completed, the second photoresist film pattern 25 and the remaining portions of silicon nitride film 24 are removed from the wafer.

Figure 3E:
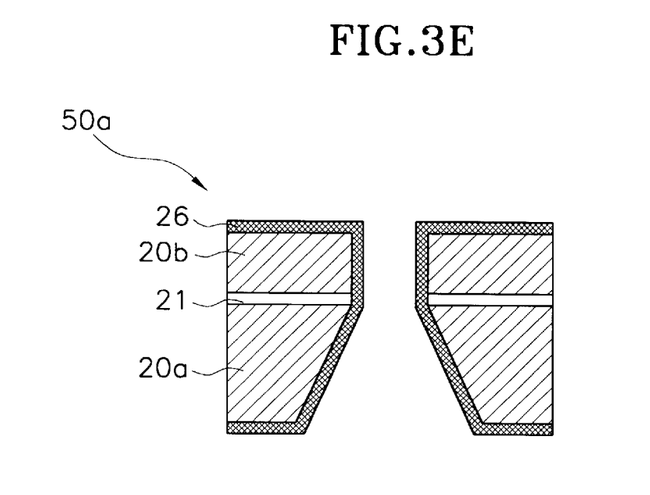

Referring to FIG. 3E, a after removing the second photoresist film pattern 25, the first mask 50a is completed by coating each of the exposed surfaces with a metal layer 26, preferably platinum. The conductive metal layer 26 serves to prevent the accumulation of an electron charge on the upper and lower part of the wafer or on the inner surface of the etched wafer during the imaging process.

Figure 4A:
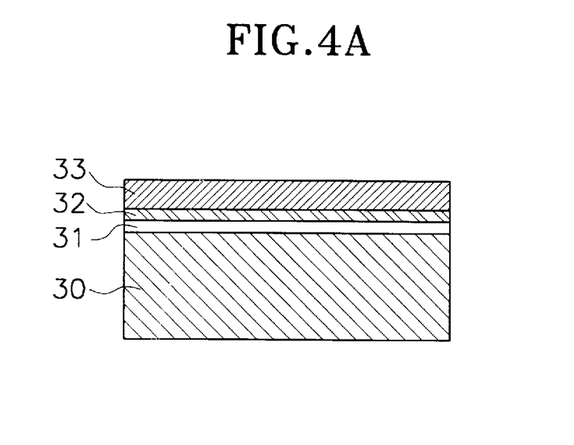
FIG. 4A through FIG. 4D are cross-sectional views of production steps of a second mask utilized in constructing a stencil mask in accordance with the present invention.

On the other hand, referring to FIG. 4A, a titanium film 31, and a titanium nitride film 32, and a tungsten film 33 are sequentially deposited over a second silicon film 30.

Figure 4B:
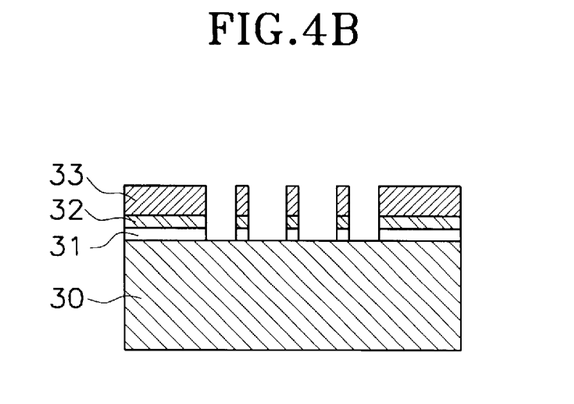

Referring to FIG. 4B, he tungsten film 33, titanium nitride film 32, and titanium film 31 are patterned with a third photoresist film pattern (not illustrated) and sequentially etched to expose portions of the silicon film 30.

Figure 4C:
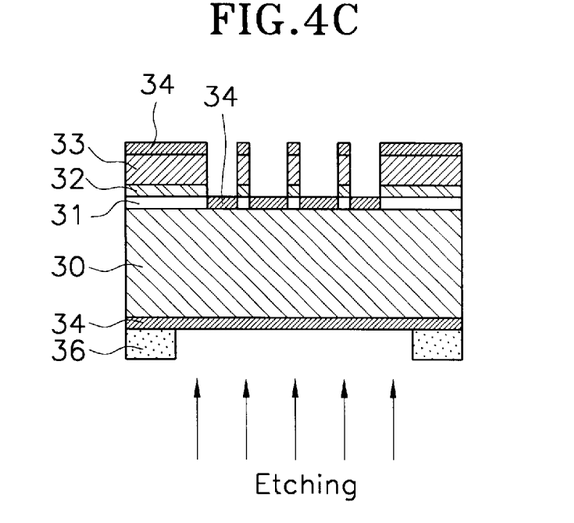

Referring to FIG. 4C, after the third photoresist pattern (not shown) is removed, the upper lower part and side wall of the etched silicon film are respectively coated with a second silicon nitride film 34. A fourth photoresist film pattern 36 is then formed over the second nitride film 34 on the lower part of the silicon film 30. A backside window pattern is then formed on the lower part of the wafer using a fourth photoresist film pattern 36 with the second silicon nitride film 34 functioning as a pattern protection film.

Figure 4D:
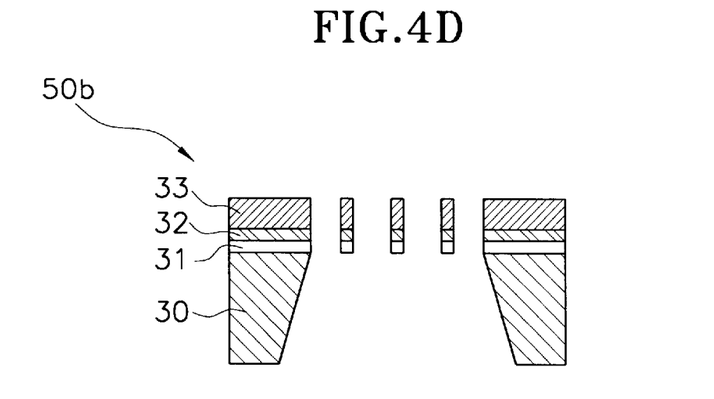

Referring to FIG. 4D, after the exposed backside silicon nitride film 34 and the silicon film 30 have been sequentially etched using the fourth photoresist film pattern 36 as the etch mask, the second mask 50b is completed by removing the fourth photoresst film pattern 36 and the remaining portions of the second silicon nitride film 34.

Figure 5:
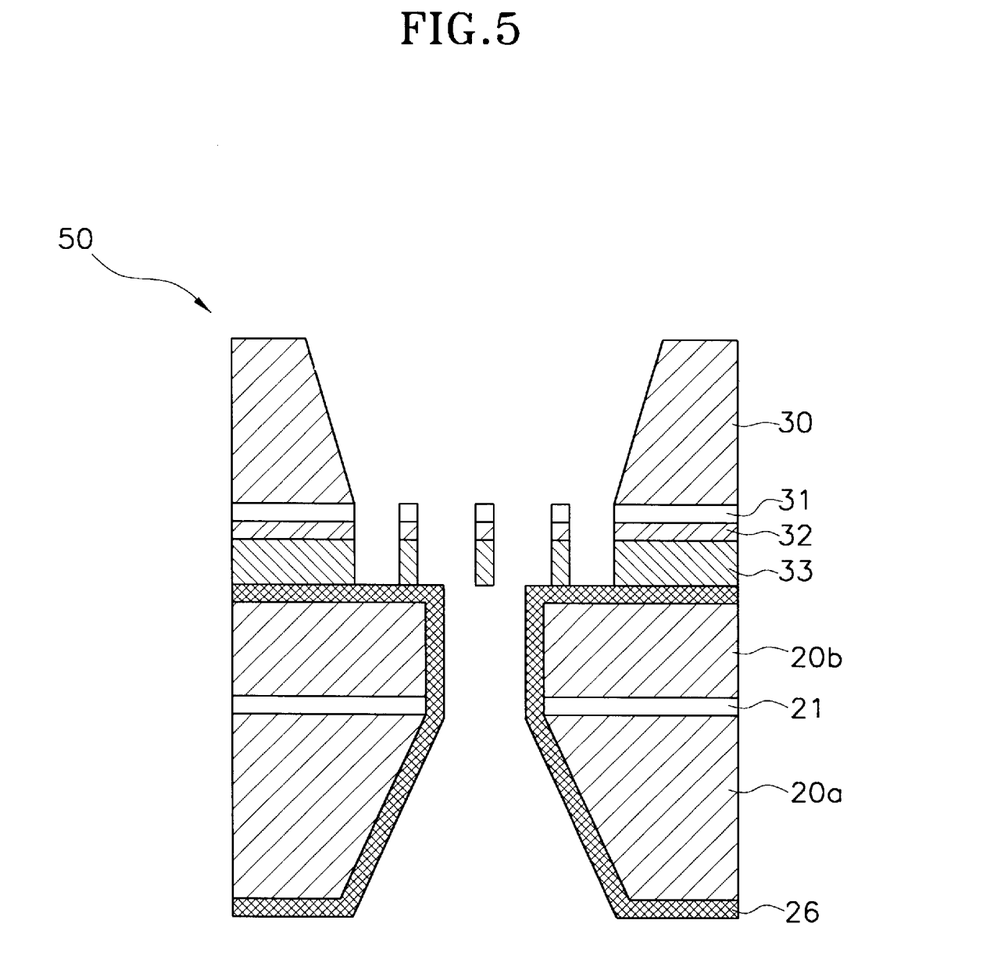
FIG. 5 is a drawing illustrating a stencil mask configuration and the resulting energy distribution provided by a stencil mask constructed in accordance with the present invention.

Referring to FIG. 5, the stencil mask 50 is completed by aligning and joining a first mask 50a, such as the one shown in FIG. 3E, and an inverted second mask 50b, such as the one shown in FIG. 4D, preferably using a silver paste between the adjacent tungsten layer 33 of the second mask and the metal layer 26 of the first mask. The thickness of the paste layer is preferably within a range between 10 and 70 Å.

In accordance with the present invention, although Pt is the preferred material, a suitable stencil mask may be constructed using Au, W, Pd, or one of their alloys as an alternative material for forming metal layer 26 with a preferred thickness of 500~3000 Å. Both the first and second nitride films are preferably formed of $Si_3N_4$, SiON or other nitride materials.

Figure 6:
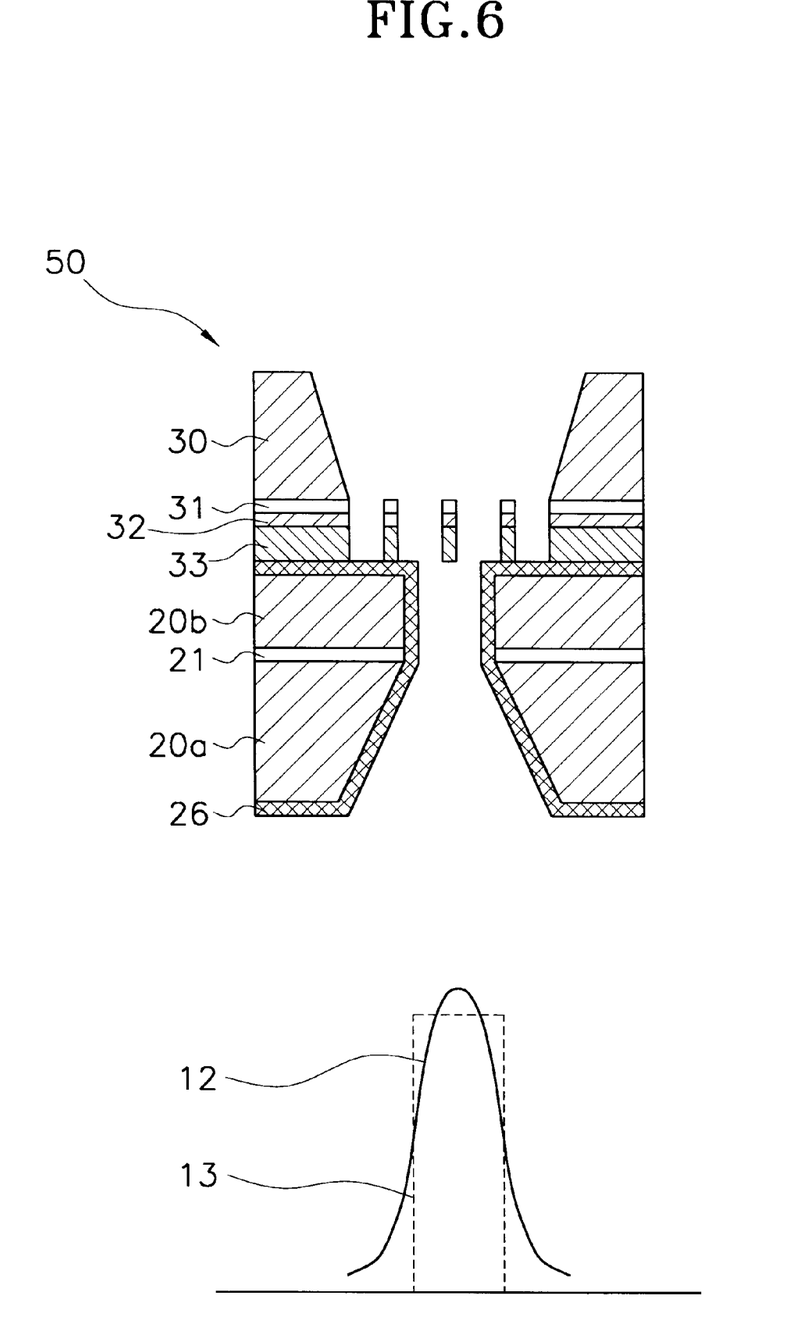

FIG. 6 is provided to illustrate both a stencil mask structure and the resulting energy distribution provided by a stencil mask constructed according to the present invention. In FIG. 6, a solid line 12 shows the contrast of a stencil mask according to the present invention and a broken line 13 shows the ideal contrast.

When constructed in accordance with the present invention, a stencil mask improves image contrast by selectively decreasing the number and adjusting the pattern of the electrons transmitted through the mask, thereby reducing beam blur resulting from coulomb repulsion within the electron beam. The reduction in beam blur provided by the disclosed stencil mask also results in improved resolution for electron beam photolithography processes using a variable shaped beam and in mask fabrication.

The invention may be embodied in other specific forms without departing form the spirit or essential characteristics thereof. The present embodiment is therefore to be considered in all respects as illustrative and not restrictive. And all changes which come within the meaning and range of equivalency of the claims are therefore intended to be embraced therein.

What is claimed is:

1. A method for fabricating a stencil mask comprising the steps of:
   preparing a first wafer consisting of
      a first silicon film having an upper surface and a lower surface,
      a silicon oxide film formed on the upper surface of the first silicon film, and
      a second silicon film formed on an upper surface of the silicon oxide film;
   forming a first photoresist film pattern on the second silicon film;
   etching the second silicon film to expose the silicon oxide film and to form a first etched surface;
   removing the first photoresist film pattern;
   forming a first silicon nitride film on the first etched surface of the second silicon film and lower surface of the first silicon film and side walls of the first and second silicon films and the silicon oxide film;
   forming a second photoresist film pattern on the second silicon nitride film;
   etching the first silicon nitride film, the first silicon film, and the silicon oxide film using the second photoresist film pattern film as an etching mask;
   removing the second photoresist pattern film;
   removing the first silicon nitride film to form a first opening through the first wafer;
   forming a first metal film on all surfaces of the first wafer, including the lower surface of the first silicon layer and the upper surface of the second silicon layer, to complete a first mask;
   preparing a second wafer consisting of
      a third silicon film having an upper surface and a lower surface,
      a titanium film formed on the upper surface of the third silicon film,
      a titanium nitride film formed on an upper surface of the titanium film, and
      a second metal film formed on an upper surface of the titanium nitride film;
   forming a third photoresist film pattern on an upper surface of the second metal film;
   etching the second metal film, the titanium nitride film, and the titanium film to expose the third silicon film using the third photoresist film pattern as an etching mask to form a second etched surface;
   removing the third photoresist film pattern;
   forming a second silicon nitride film on the second etched surface of the third silicon film, the lower surface of the third silicon film and side wall of the second wafer;
   forming a fourth photoresist film pattern on the second silicon nitride film on the lower part of the third silicon film;
   etching the second silicon nitride film and the third silicon film using a fourth photoresist film pattern as an etching mask;
   removing the fourth photoresist film pattern;
   removing the second silicon nitride film to complete a second mask to form a plurality of second openings through the second wafer;
   aligning the first opening with the second openings; and
   joining the first mask and the second mask by applying a conductive adhesive between the first metal layer of the first mask and the second metal layer of the second mask to form the stencil mask.

2. The method according to claim 1, wherein the first metal layer of the first mask comprises a metal selected from the group consisting of Au, W, Pt, Pd, and their alloys.

3. The method according to claim 2, wherein the thickness of the first metal layer is about 500~3000 Å.

4. The method according to claim 1, wherein the second metal layer on the second mask comprises a metal selected from the group consisting of Au, W, Pt, Pd, and their alloys.

5. The method according to claim 4, wherein the thickness of the second metal layer is about 500~3000 Å.

6. The method according to claim 1, wherein each of the nitride films comprise $Si_3N_4$.

7. The method according to claim 1, wherein the first nitride film and the second nitride film are formed simultaneously.

8. The method according to claim 7, wherein the third nitride film and the fourth nitride film are formed simultaneously.

9. The method according to claim 1, wherein the conductive adhesive comprises a silver paste.

* * * * *